July 8, 1969 E. DAVIES 3,454,793

SCHMITT TRIGGER CIRCUITS

Filed Jan. 24, 1966

INVENTOR

Eric Davies

BY Baldwin & Wight

ATTORNEYS

United States Patent Office 3,454,793

Patented July 8, 1969

3,454,793

SCHMITT TRIGGER CIRCUITS

Eric Davies, Danbury, Essex, England, assignor to The Marconi Company Limited, London, England, a British company Filed Jan. 24, 1966, Ser. No. 522,490

Claims priority, application Great Britain, Feb. 8, 1965, 5,464/65

Int. Cl. H03k 3/34

U.S. Cl. 307—290 3 Claims

ABSTRACT OF THE DISCLOSURE

A Schmitt trigger circuit is disclosed herein, the first transistor of which is coupled to the second through a circuit which includes a Zener diode connecting the base of the second transistor to a point in the collector circuit of the first transistor. The point in the collector circuit of the first transistor is so chosen that a relatively small portion of the collector load circuit of the first transistor is utilized as a low impedance driving source for the second transistor.

This invention relates to Schmitt trigger circuits and has for its object to provide improved Schmitt trigger circuits using transistors as the active elements thereof.

Schmitt trigger circuits with valves as the active elements thereof are extensively used for satisfying the common requirement of producing substantially identical amplitude phase opposed square waves. The known Schmitt trigger transistor circuits which are like the commonly used valve circuits except that transistors are substituted for valves, are not however, satisfactory for such purposes. The reasons why this is so will first be explained with reference to FIGURE 1 of the accompanying drawings which is a diagram of a typical known Schmitt trigger transistor circuit.

Figure 1:
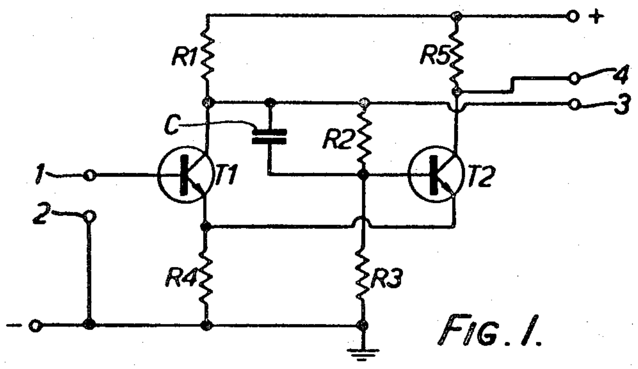

Referring to FIGURE 1 an input triggering waveform is applied at terminals 1, 2 at an appropriate D.C. bias level from a source (not shown) of suitable impedance to the base of a first transistor T1 the collector of which is connected through a collector load resistance R1 to the positive terminal of a source (not shown) of positive potential, to one (3) of the two output terminals 3, 4 and also through a resistance R2 in parallel with a condenser C to the base of the second transistor T2. The base of the said second transistor is connected to input terminal 2 and to the negative terminal of the supply source through a resistance R3 and the emitters of T1 and T2 are connected to the same terminal through a resistance R4. The collector of the second transistor is connected to the positive supply terminal through a resistance R5 and also to the second output terminal 4.

The circuit is, as will be seen, a well known Schmitt trigger valve circuit with transistors substituted for valves. However the input impedance of a transistor, unlike that of a valve, is low because base current flows when the transistor is in conduction and it is necessary, for stable operation, that the total resistance between base and emitter shall be relatively low—in practice not exceeding a few thousand ohms. Consequently resistance R3 must be of fairly low value and if the requirement that the gain of transistor T1 (taken at the base of transistor T2) shall exceed unity is satisfied, there is considerable loading imposed in effective parallel with R1. Accordingly the D.C. potentials and gains at the collectors of transistors T1 and T2 are not balanced to anything like the same degree of balance as is readily achievable in the corresponding valve circuit. The present invention seeks to overcome this defect.

According to this invention the first transistor of a Schmitt trigger transistor circuit is coupled to the second transistor thereof through a coupling circuit which includes a Zener diode, said circuit connecting the base of the second transistor to a point in the collector circuit of the first transistor so chosen that a relatively small portion of the collector load circuit of said first transistor is utilized as a low impedance driving source for the second transistor.

Preferably a resistance is included in the coupling circuit to limit the base current of the second transistor.

In one embodiment of the invention the collector of the first transistor is connected to one terminal of a supply source through a first collector resistance; the emitters of the two transistors are connected to the other supply source terminal through an emitter resistance; the collector of the second transistor is connected to said one supply terminal through a second collector resistance; and driving voltage for the base of the second transistor is taken from the junction point of a coupling Zener diode and a resistance in series in a circuit extending from an intermediate tap on said first collector resistance to said other supply source terminal, the output terminals of the whole arrangement being connected respectively to the two collectors.

Preferably a further resistance is connected between the base of the second transistor and the aforesaid junction point.

Where a very high degree of symmetry as respects output waveform amplitude and D.C. excursion is required a second, similar Zener diode in series with a resistance equal to the parallel resistance of the resistance in series with the coupling Zener diode and the input impedance of the second transistor as seen from said junction point may be between an intermediate tap on the second collector resistance and said other supply source terminal, the resistance between said one supply source terminal and the two intermediate taps on the collector resistances being equal.

Figure 2:
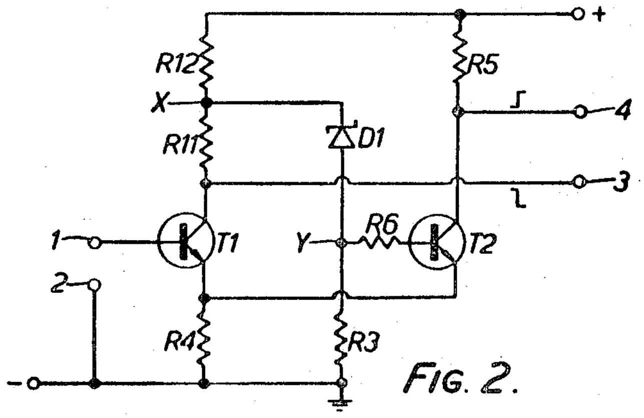
Figure 3:
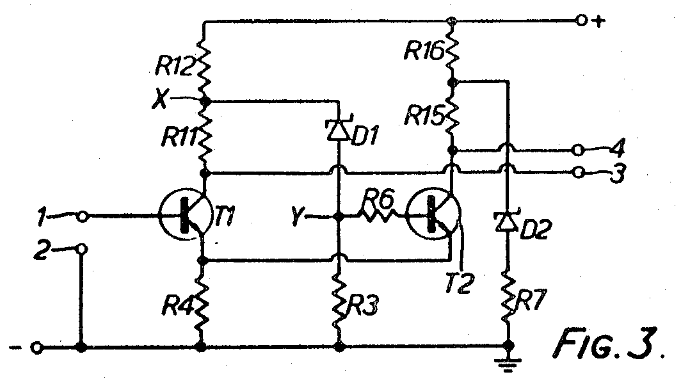

FIGURES 2 and 3 of the accompanying drawings show diagrammatically two embodiments of the present invention.

Comparing FIGURES 1 and 2 it will be seen that, in FIGURE 2, the collector load resistance is, in effect, tapped at an intermediate point, the resistance R1 of FIGURE 1 being replaced by two resistances R11 and R12 in series and the junction point X of these resistances being connected through a coupling Zener diode D1 in series with a resistance R3 to the negative supply terminal. The junction point Y of D1 with R3 is connected to the base of transistor T2, preferably (though not necessarily) through a resistance R6.

The slope resistance of the Zener diode D1 coupling the T1 collector to the T2 base is, in a typical practical case, about 20 ohms, so the waveform amplitudes at points X and Y will be practically the same. The Zener diode voltage and operating current are so chosen as to provide the required D.C. potential at the base of transistor T2 to maintain it conducting when transistor T1 is non-conducting. The values of R11 and R12 are chosen to give a little more than unity gain at the base of transistor T2.

When transistor T1 is driven into the conductive state by an applied input waveform the usual regenerative action of a Schmitt trigger circuit occurs and transistor T2 is rapidly cut off. For best operation the circuit elements should be dimensioned in accordance with known principles to ensure that the Zener diode voltage is substantially constant whichever transistor is in conduction.

With practical circuit tolerances the voltage at Y might, if the limiting resistance R6 were not provided, produce excessive base current in transistor T2 and it is therefore preferred to provide this resistance R6 to limit such base current to a safe value. When high switching speeds are required and R12 is consequently of low value, it is particularly desirable to provide the resistance R6. The input waveform source (not shown) connected to the two terminals 1, 2 should have an impedance high enough to ensure that excessive base current flow in the transistor T1 or a limiting resistance (not shown) could be provided for this purpose.

Because R12 can be of comparatively low value and the Zener diode current flowing when transistor T1 is non-conducting can be arranged to be quite moderate, R5 can be made of a value approaching the sum of the values of R11 and R12. If R5 were equal to this said value the outputs at terminals 3 and 4 would be substantially identical in amplitude.

FIGURE 3 shows a modification providing still better output symmetry and balance than FIGURE 2. FIGURE 3 differs from FIGURE 2 in that the collector resistance of the second transistor is also tapped, the resistance R5 of FIGURE 2 being replaced by two series resistances R15, R16 the junction point of which is taken to the negative supply terminal through a second Zener diode D2 in series with a resistance R7. D1 and D2 are, as nearly as possible, identical Zener diodes; R16 is made equal to R12; and R7 is made equal to the parallel resistance of R3 with the input impedance of transistor T2 as seen from the driving point Y. With this arrangement substantially perfect output balance and symmetry are obtained.

It will now be seen that the object of the invention—the achievement of reasonably good output balance and symmetry—is obtained by using a Zener diode to couple the two stages so as to provide correct D.C. potential at the second stage without loss of waveform amplitude, thus enabling a quite small fraction of the collector load of the first stage to be used as a low impedance driving source for the second stage so that the impedance of the effective sources of the waveforms at the two output terminals are similar.

The invention is obviously not limited to the particular circuits shown in FIGURES 2 and 3. Thus, for example, transistors of opposite types to those shown can be used with suitable polarity changes of applied potentials.

I claim:

1. A Schmitt trigger circuit including first and second transistors, the collector of the first transistor being connected to one terminal of a supply source through a first collector resistance; the emitters of the two transistors being connected to another supply source terminal through an emitter resistance; the collector of the second transistor being connected to said one supply terminal through a second collector resistance; circuit means coupling together said first and said second transistors; said circuit means including a coupling Zener diode and a resistance connected in series and extending from an intermediate tap on said first collector resistance to said another supply source terminal, said Zener diode connecting the base of said second transistor to said tap to provide driving voltage for said base of said second transistor from the junction point of said Zener diode and resistance connected in series, said tap providing a relatively small portion of the collector load circuit of said first transistor as a low impedance driving source for the second transistor; and output terminals for the whole trigger circuit being connected respectively to the two collectors.

2. A Schmitt trigger circuit as claimed in claim 1 wherein a further resistance is connected between the base of the second transistor and the aforesaid junction point.

3. A Schmitt trigger circuit as claimed in claim 1 wherein a second Zener diode in series with a resistance equal to the parallel resistance of the resistance in series with the coupling Zener diode and the input impedance of the second transistor as seen from said junction point is connected between an intermediate tap on the second collector resistance and said other supply source terminal, the resistances between said one supply source terminal and the two intermediate taps on the collector resistances being equal.

References Cited

UNITED STATES PATENTS

| | | | |
|---|---|---|---|
| 2,840,728 | 6/1958 | Haugk et al. | 307—285 |
| 2,964,655 | 12/1960 | Mann | 307—318 |
| 3,095,512 | 6/1963 | Little | 307—318 |
| 3,109,944 | 11/1963 | Seestrom | 307—285 |
| 3,205,422 | 9/1965 | Gold | 307—318 |
| 3,287,653 | 11/1966 | Goordman | 307—318 |

JOHN S. HEYMAN, *Primary Examiner.*

H. A. DIXON, *Assistant Examiner.*

U.S. Cl. X.R.

307—285